(12) United States Patent
Gronin et al.

(10) Patent No.: US 12,355,214 B2
(45) Date of Patent: *Jul. 8, 2025

(54) LASER EMITTER INCLUDING NANOWIRES

(71) Applicant: Microsoft Technology Licensing, LLC, Redmond, WA (US)

(72) Inventors: Sergei V. Gronin, West Lafayette, IN (US); Geoffrey Charles Gardner, West Lafayette, IN (US); Raymond Leonard Kallaher, West Lafayette, IN (US)

(73) Assignee: Microsoft Technology Licensing, LLC, Redmond, WA (US)

(*) Notice: Subject to any disclaimer, the term of this patent is extended or adjusted under 35 U.S.C. 154(b) by 621 days.

This patent is subject to a terminal disclaimer.

(21) Appl. No.: 17/805,621

(22) Filed: Jun. 6, 2022

(65) Prior Publication Data
US 2022/0311216 A1 Sep. 29, 2022

Related U.S. Application Data

(63) Continuation of application No. 16/884,439, filed on May 27, 2020, now Pat. No. 11,362,487.

(51) Int. Cl.
*H01S 5/34* (2006.01)
*H01S 5/04* (2006.01)
*H01S 5/042* (2006.01)
*H01S 5/20* (2006.01)
(Continued)

(52) U.S. Cl.
CPC .............. *H01S 5/341* (2013.01); *H01S 5/041* (2013.01); *H01S 5/042* (2013.01); *H01S 5/2077* (2013.01); *H01S 5/34313* (2013.01); *H01S 5/4087* (2013.01)

(58) Field of Classification Search
CPC ................... H01S 5/40–426; H01S 5/2077
See application file for complete search history.

(56) References Cited

U.S. PATENT DOCUMENTS

| | | | | |
|---|---|---|---|---|
| 6,818,465 B2* | 11/2004 | Biwa | .................. | H01S 5/10 |
| | | | | 257/190 |
| 6,881,982 B2* | 4/2005 | Okuyama | ............... | H01J 63/06 |
| | | | | 257/91 |

(Continued)

FOREIGN PATENT DOCUMENTS

JP 2012222001 A * 11/2012

*Primary Examiner* — Tod T Van Roy
(74) *Attorney, Agent, or Firm* — Alleman Hall & Tuttle LLP

(57) ABSTRACT

A laser emitter is provided, including a substrate and a dielectric mask layer located proximate to and above the substrate in a thickness direction. The dielectric mask layer may have a plurality of trenches formed therein. The plurality of trenches may have a plurality of different respective widths. The laser emitter may further include a respective nanowire located within each trench of the plurality of trenches. Each nanowire may include a first semiconductor layer located above the substrate in the thickness direction. Each nanowire may further include a quantum well layer located proximate to and above the first semiconductor layer in the thickness direction. Each nanowire may further include a second semiconductor layer located proximate to and above the quantum well layer in the thickness direction.

20 Claims, 12 Drawing Sheets

(51) Int. Cl.
  *H01S 5/343*     (2006.01)
  *H01S 5/40*      (2006.01)

(56) References Cited

U.S. PATENT DOCUMENTS

| | | | | |
|---|---|---|---|---|
| 7,957,446 | B2* | 6/2011 | Yagi | H01S 5/125 |
| | | | | 372/45.01 |
| 9,997,893 | B2* | 6/2018 | Lee | H01S 5/2272 |
| 11,362,487 | B2* | 6/2022 | Gronin | H01S 5/041 |
| 2001/0008539 | A1* | 7/2001 | Kudo | G02B 6/12004 |
| | | | | 372/50.1 |
| 2002/0075927 | A1* | 6/2002 | Furushima | H01S 5/227 |
| | | | | 372/46.01 |
| 2003/0143771 | A1* | 7/2003 | Kidoguchi | H10H 20/835 |
| | | | | 257/E33.068 |
| 2006/0060833 | A1* | 3/2006 | Bruckner | H01S 5/4031 |
| | | | | 257/13 |
| 2014/0064312 | A1* | 3/2014 | Lee | H01L 21/0237 |
| | | | | 257/15 |
| 2014/0219306 | A1* | 8/2014 | Wright | H01S 5/187 |
| | | | | 372/45.012 |
| 2014/0242782 | A1* | 8/2014 | Cho | H10F 71/1278 |
| | | | | 438/597 |
| 2020/0036163 | A1* | 1/2020 | Nishioka | H01S 5/11 |
| 2020/0106244 | A1* | 4/2020 | Noda | H01S 5/34333 |
| 2021/0376572 | A1* | 12/2021 | Gronin | H01S 5/2077 |
| 2022/0311216 | A1* | 9/2022 | Gronin | H01S 5/042 |

* cited by examiner

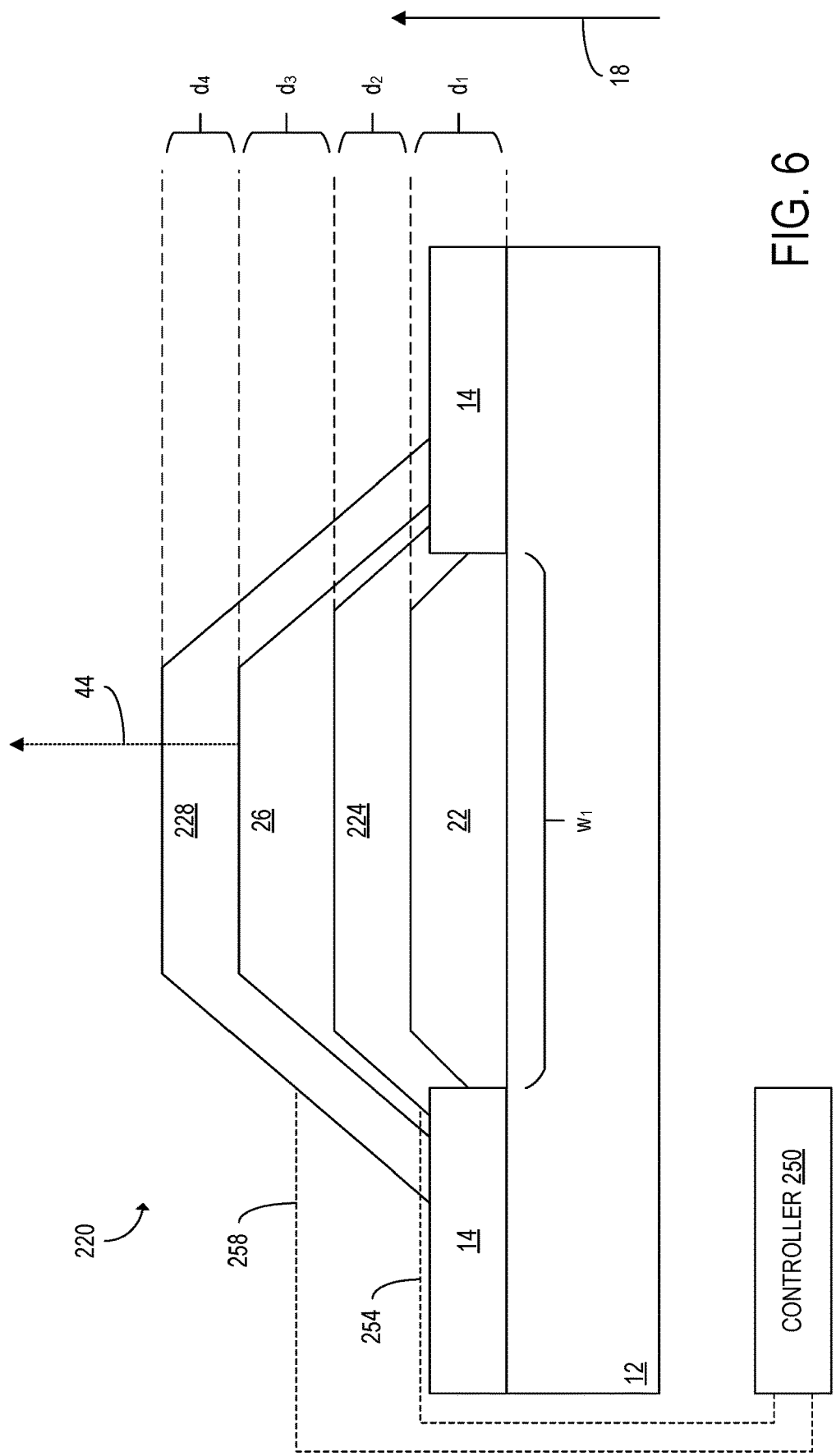

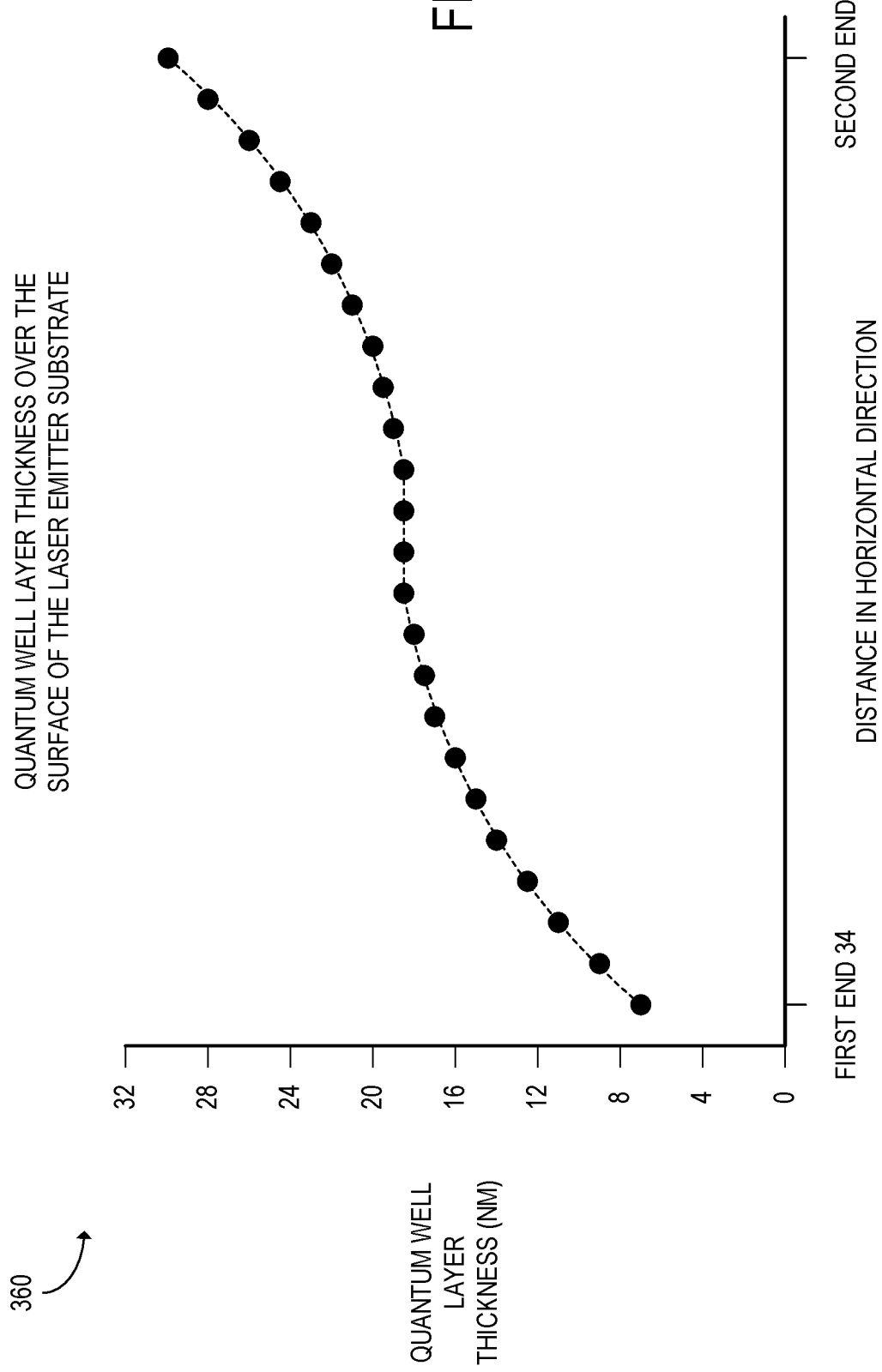

LASER EMITTER INCLUDING NANOWIRES

CROSS REFERENCE TO RELATED APPLICATIONS

This application is a continuation of U.S. patent application Ser. No. 16/884,439, filed May 27, 2020, the entirety of which is hereby incorporated herein by reference for all purposes.

BACKGROUND

Broadband infrared lasers are used in a variety of different types of devices, such as manufacturing robots and head-mounted display devices. For example, broadband infrared lasers may be used to perform depth imaging of surfaces.

SUMMARY

According to one aspect of the present disclosure, a laser emitter is provided, including a substrate and a dielectric mask layer located proximate to and above the substrate in a thickness direction. The dielectric mask layer may have a plurality of trenches formed therein. The plurality of trenches may have a plurality of different respective widths. The laser emitter may further include a respective nanowire located within each trench of the plurality of trenches. Each nanowire may include a first semiconductor layer located above the substrate in the thickness direction. Each nanowire may further include a quantum well layer located proximate to and above the first semiconductor layer in the thickness direction. Each nanowire may further include a second semiconductor layer located proximate to and above the quantum well layer in the thickness direction.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 6 shows a cross-sectional view of an example nanowire in which the first semiconductor layer and the second semiconductor layer are doped layers, according to the embodiment of FIG. 1.

FIG. 8A shows an example plot of quantum well thickness as a function of position on the substrate when the thicknesses of the quantum well layers vary according to a nonlinear function, according to the embodiment of FIG. 1.

DETAILED DESCRIPTION

Existing broadband infrared lasers are typically manufactured by providing self-organized quantum dots on a substrate. For example, the quantum dots may be indium arsenide (InAs) quantum dots. The wavelength of light emitted by each quantum dot is determined by the size of the quantum well included in that quantum dot. However, existing methods of manufacturing broadband infrared lasers may allow for less control over the sizes of the quantum dots than would be desirable. Thus, the manufacturer of the broadband infrared laser may be unable to precisely control the emission spectrum of the laser.

Figure 1:
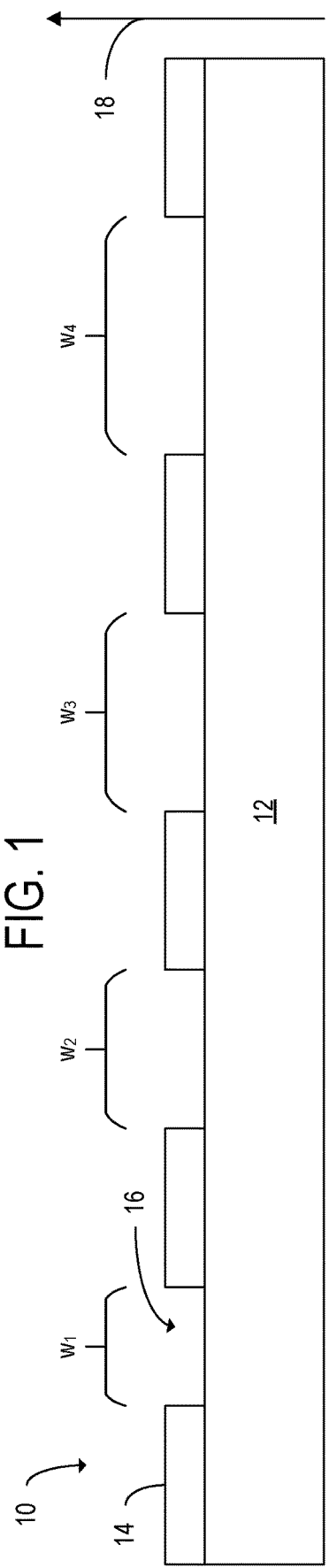
FIG. 1 shows a cross-sectional view of a substrate and dielectric mask layer of a laser emitter, according to one embodiment of the present disclosure.

In order to address the above issue, a laser emitter 10 is provided, as shown in the example embodiment of FIG. 1. FIG. 1 shows a cross-sectional view of a substrate 12 and a dielectric mask layer 14 of the laser emitter 10. As depicted in FIG. 1, the dielectric mask layer 14 may be located proximate to and above the substrate 12 in a thickness direction 18 of the laser emitter 10. The substrate 12 may, for example, be formed of silicon (Si), indium phosphide (InP), gallium arsenide (GaAs), or some other suitable material. The dielectric mask layer 14 may be a silicon oxide ($SiO_x$) layer. For example, the dielectric mask layer 14 may be formed of silicon dioxide ($SiO_2$). Alternatively, some other material may be used for the dielectric mask layer 14.

As shown in FIG. 1, a plurality of trenches 16 may be formed in the dielectric mask layer 14. The plurality of trenches 16 may have a plurality of different respective widths $w_i$. In the example of FIG. 1, four trenches 16 having respective widths $w_1$, $w_2$, $w_3$, and $w_4$ are shown. The respective widths $w_1$, $w_2$, $w_3$, and $w_4$ of each of the trenches 16 shown in FIG. 1 all different from each other. However, in other embodiments, two or more trenches 16 of the plurality of trenches 16 may have substantially equal widths $w_i$. In some embodiments, the respective widths $w_i$ of the trenches 16 may each be between 50 nm and 300 nm.

Figure 2:
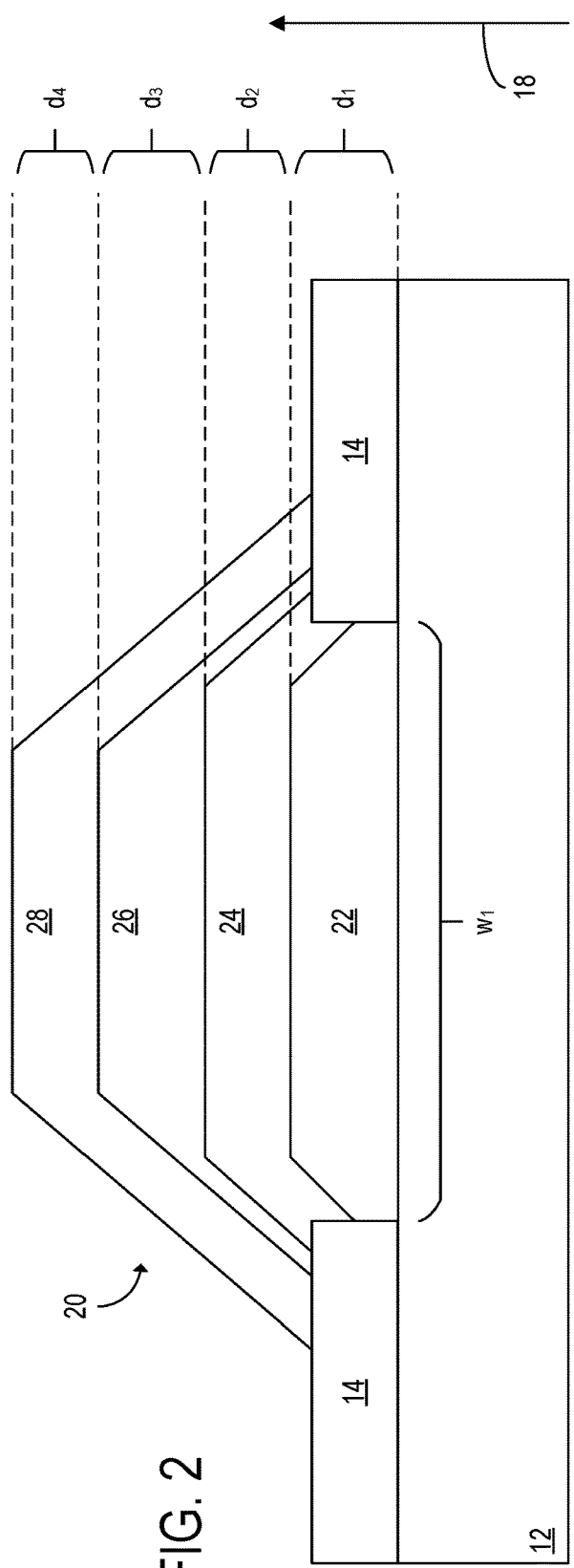
FIG. 2 shows a cross-sectional view of a nanowire located in a trench in the dielectric mask layer of the laser emitter, according to the embodiment of FIG. 1.

As shown in FIG. 2, a respective nanowire 20 may be located within each trench 16 of the plurality of trenches 16. The nanowire 20 shown in FIG. 2 may be formed in the leftmost trench 16 of FIG. 1, which has a width $w_1$. The nanowire 20 may have a trapezoidal cross-sectional profile. As discussed in further detail below, each nanowire 20 may be formed via selective area growth.

Each nanowire 20 may include a first semiconductor layer 24 located above the substrate 12 in the thickness direction 18. The first semiconductor layer 24 may, for example, be an indium gallium arsenide (InGaAs) layer.

Each nanowire 20 may further include a respective quantum well layer 26 located proximate to and above the first semiconductor layer 24 in the thickness direction 18. The quantum well layer 26 may be the active layer of the nanowire 20 in which lasing occurs. The quantum well layer 26 may be an indium arsenide (InAs) layer or may alternatively be formed from some other material.

Each nanowire 20 may further include a second semiconductor layer 28 located proximate to and above the quantum well layer 26 in the thickness direction 18. The second semiconductor layer 28 may be an indium gallium arsenide (InGaAs) layer. In some embodiments, the first semiconductor layer 24 and the second semiconductor layer 28 may have different compositions. In embodiments in which the first semiconductor layer 24 and the second semiconductor layer 28 are both InGaAs layers, the gallium levels in the first semiconductor layer 24 and the second semiconductor layer 28 may be different, such that the first semiconductor layer 24 has a composition $InGa_{x1}As$ and the second semiconductor layer 28 has a composition $InGa_{x2}As$.

In some embodiments, each nanowire 20 may further include a seed layer 22 located proximate to and above the substrate 12 in the thickness direction 18 and proximate to and below the first semiconductor layer 24 in the thickness direction 18. The seed layer 22 may be a gallium arsenide antimony (GaAsSb) layer. For example, the seed layer 22 may have the composition $GaAsSb_{0.05}$. Alternatively, the seed layer 22 may have some other composition.

In some embodiments, other layers may be included in the laser emitter 10. For example, a cladding layer, a waveguide layer, or some other type of layer may be located above the second semiconductor layer 28. Additionally or alternatively, one or more additional layers located between the seed layer 22 and the first semiconductor layer 24 may be included in the nanowire 20.

As shown in the example of FIG. 2, the seed layer 22 may have a thickness $d_1$, the first semiconductor layer 24 may have a thickness $d_2$, the quantum well layer 26 may have a thickness $d_3$, and the second semiconductor layer 28 may have a thickness $d_4$. The thickness $d_3$ of the quantum well layer 26 may determine the wavelength of the light emitted by the nanowire 20. For example, each quantum well layer 26 may have a respective thickness $d_3$ between 7 nm and 30 nm. In some embodiments, when a quantum well layer 26 has a thickness $d_3$ within this range, the nanowire 20 may emit light with a wavelength between 900 nm and 3500 nm. The wavelength of the light emitted by a nanowire 20 may be proportional to the thickness $d_3$ of the quantum well layer 26 of the nanowire 20.

Figure 3:
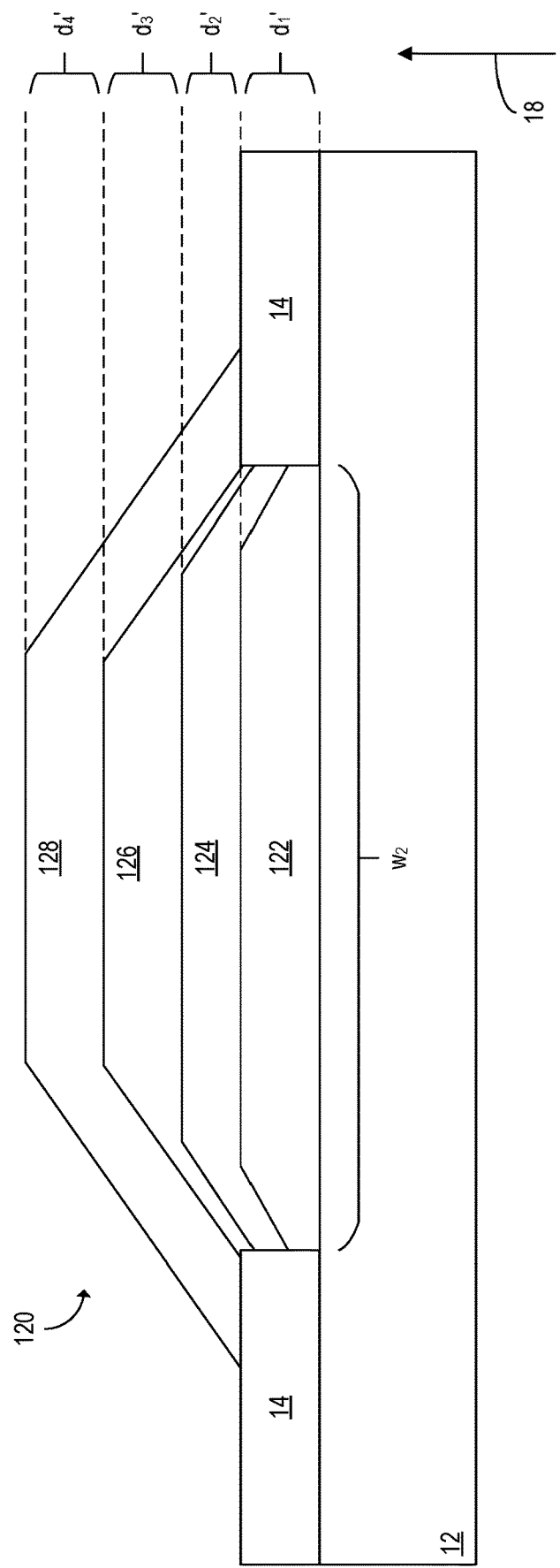
FIG. 3 shows a cross-sectional view of another nanowire located in a trench in the dielectric mask layer having a larger width than the trench of FIG. 2, according to the embodiment of FIG. 1.

The thickness $d_3$ of each quantum well layer 26 may depend upon the width $w_i$ of the trench 16 within which that quantum well layer 26 is located. For example, when the laser emitter 10 is manufactured, each nanowire 20 included in the laser emitter 10 may be grown using the same amount of InAs. In such embodiments, for each nanowire 20, the respective thickness $d_3$ of the quantum well layer 26 of that nanowire 20 may be inversely proportional to the width $w_i$ of the trench 16 within which that nanowire 20 is located. Thus, the wavelength of the light emitted by a nanowire 20 may also be inversely proportional to the width $w_i$ of the trench 16 for that nanowire 20. FIG. 3 shows another example nanowire 120 that may be located in the trench 16 that is shown in FIG. 1 as having a width $w_2$. The width $w_2$ is larger than the width $w_1$, and accordingly, the nanowire 120 of FIG. 3 is wider than the nanowire 20 of FIG. 2. Thus, the quantum well layer 126 of the nanowire 120 may have a thickness $d_3'$ that is smaller than the thickness $d_3$ of the nanowire 20. The nanowire 120 may thereby emit light with a shorter wavelength than that of the light emitted by the nanowire 20. In addition, the nanowire 120 of FIG. 3 may include a seed layer 122 having a thickness $d_1'$, a first semiconductor layer 124 having a thickness $d_2'$, and a second semiconductor layer 128 having a thickness $d_4'$. One or more of the thicknesses $d_1'$, $d_2'$, and $d_4'$ may also be smaller than the thicknesses $d_1$, $d_2$, and $d_4$ of the corresponding layers of the nanowire 20.

Figure 4:
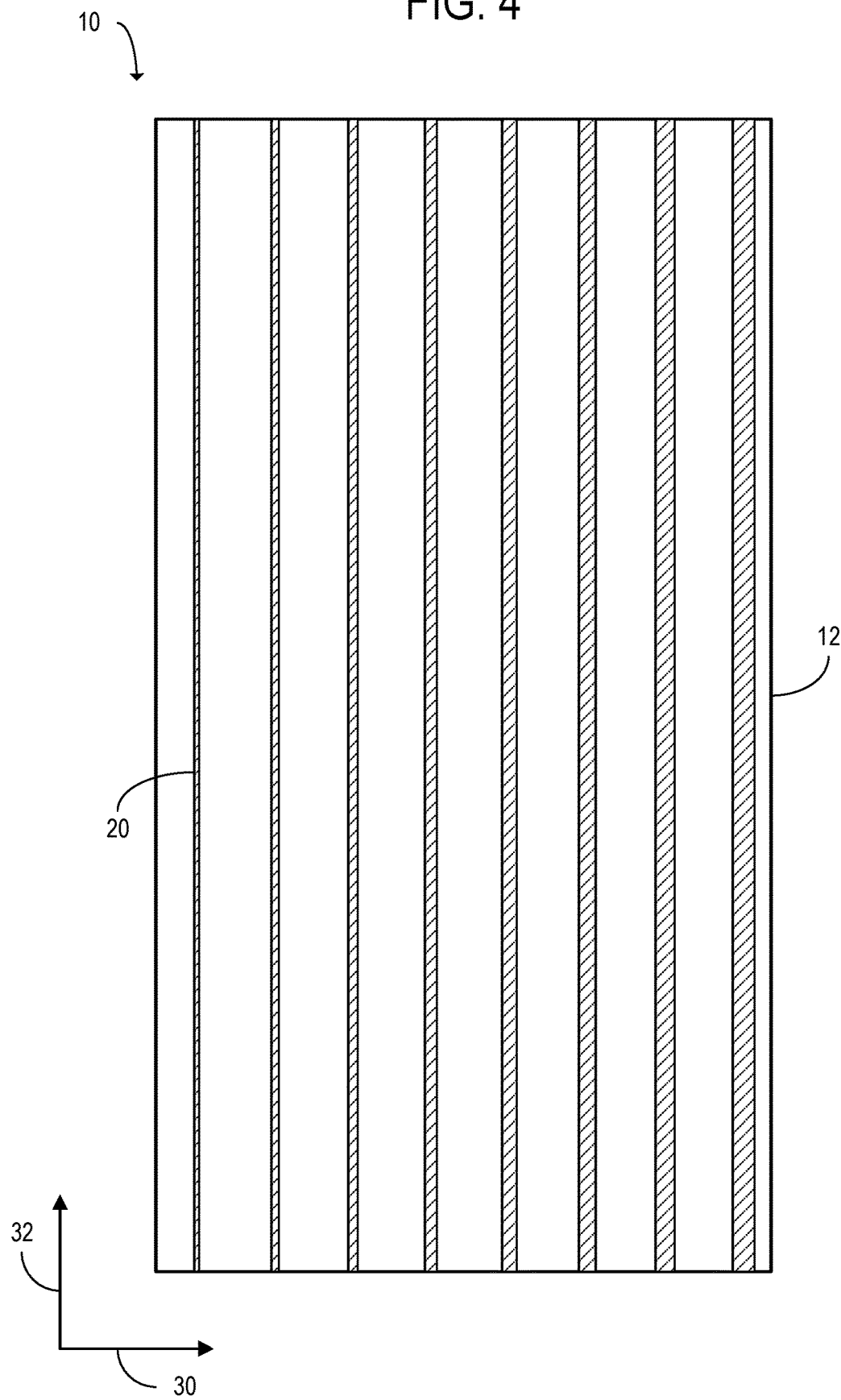
FIG. 4 shows an example top view of the laser emitter, according to the embodiment of FIG. 1.

FIG. 4 shows an example top view of the laser emitter 10, including the substrate 12 and a plurality of nanowires 20. As shown in FIG. 4, the substrate 12 may define a planar surface. The dielectric mask layer 14 may be overlaid on the planar surface of the substrate 12. When the plurality of trenches 16 are formed in the dielectric mask layer 14, the plurality of trenches 16 may be formed to be spatially dispersed in a horizontal direction 30 along the planar surface and non-overlapping in a vertical direction 32 along the planar surface. The plurality of nanowires 20 may be formed in a respective plurality of substantially parallel trenches, as shown in FIG. 4. In the example of FIG. 4, the respective widths of the nanowires 20 increase from the left end of the substrate 12 to the right end of the substrate 12.

Figure 5:
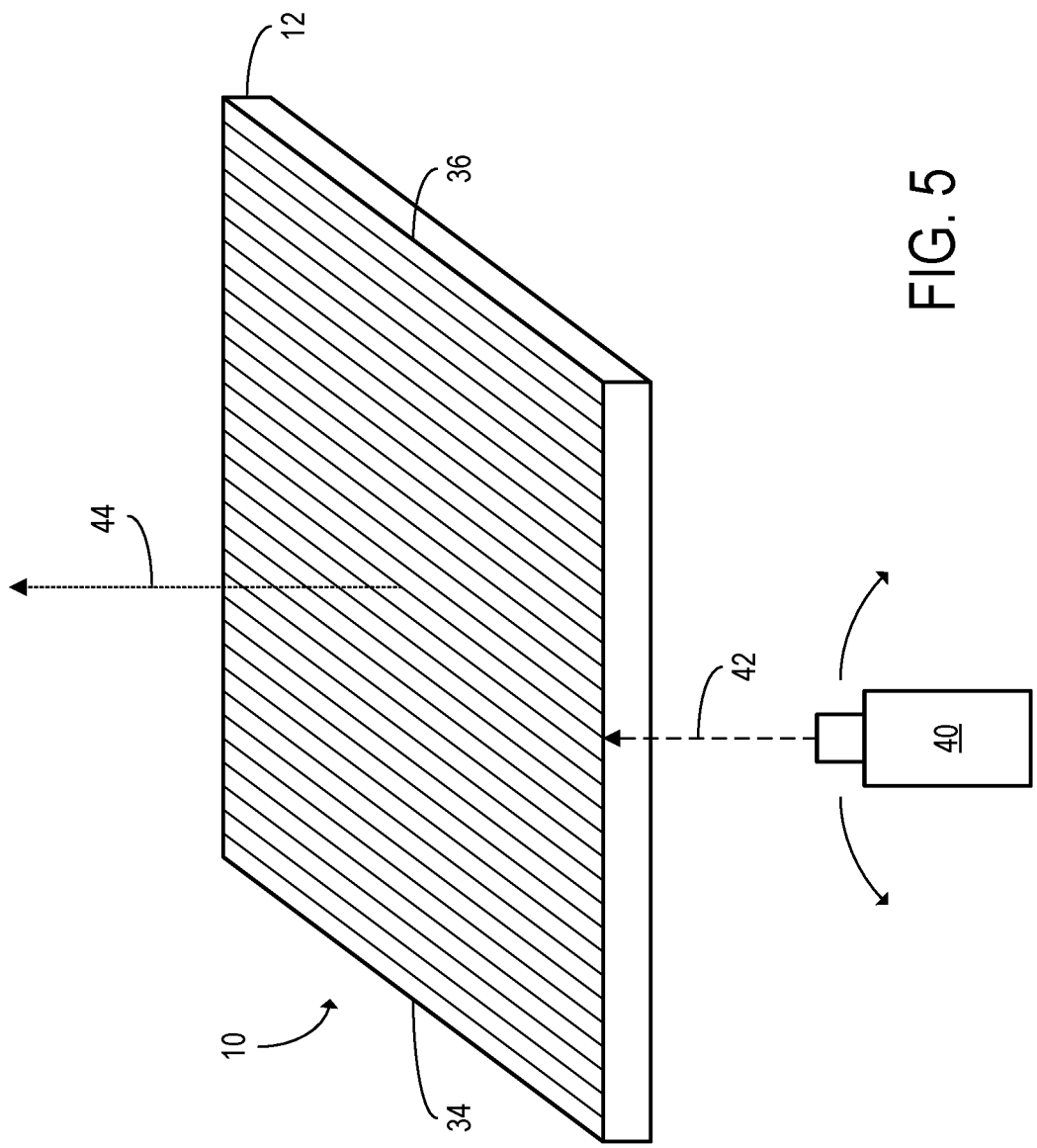
FIG. 5 shows a pumping light source from which the laser emitter is configured to receive an optical pumping signal, according to the embodiment of FIG. 1.

Turning now to FIG. 5, the laser emitter 10 may be configured to emit infrared light 44 in response to receiving an optical pumping signal 42. In the example of FIG. 5, the optical pumping signal 42 is emitted by a pumping light source 40, which may, for example, be a blue laser. The pumping light source 40 may, in some embodiments, be configured to selectively pump one or more of the nanowires 20 included in the laser emitter 10 while not pumping one or more other nanowires 20. For example, as shown in FIG. 5, the pumping light source 40 may be configured to rotate so that the area at which the optical pumping signal 42 impinges upon the substrate 12 moves between a first end 34 of the substrate 12 and a second end 36 of the substrate 12.

In the embodiment of FIG. 5, the substrate 12 may act as a waveguide via which the optical pumping signal 42 reaches the one or more nanowires 20. In other embodiments, the laser emitter 10 may include a separate waveguide layer, which may be located above or below the nanowire 20. In embodiments in which a waveguide layer is provided above the nanowire 20, the pumping light source 40 may instead be located above the laser emitter 10 and configured to project the optical pumping signal 42 downward onto the nanowires 20 through the waveguide layer.

In some embodiments, as shown in FIG. 6, the laser emitter 10 may be electrically pumped. In such embodiments, the semiconductor layers of the nanowire 20 may be doped in order to transmit a driving signal to the quantum well layer 26. FIG. 6 shows an example nanowire 220 including a doped first semiconductor layer 224 and a doped second semiconductor layer 228. The doped first semiconductor layer 224 and the doped second semiconductor layer 228 may each be formed from a p-type or n-type semiconductor. When the doped first semiconductor layer 224 is p-type, the doped second semiconductor layer 228 may be n-type, and when the doped first semiconductor layer 224 is n-type, the doped second semiconductor layer 228 may be p-type.

The laser emitter 10 may be configured to emit infrared light 44 in response to receiving an electrical pumping signal via the doped first semiconductor layer 224 and the doped second semiconductor layer 228. The doped first semiconductor layer 224 and the doped second semiconductor layer 228 may be configured to receive the electrical pumping signal via a first electrical trace 254 and a second electrical trace 258 respectively. The first electrical trace 254 and the second electrical trace 258 may be electrically coupled to a controller 252, which may, for example, be a processor. Thus, in embodiments in which the laser emitter 10 is electrically driven, the controller 252 may selectively address individual nanowires 220 to dynamically control the spectrum and energy output of the laser emitter 10.

Figure 7A:
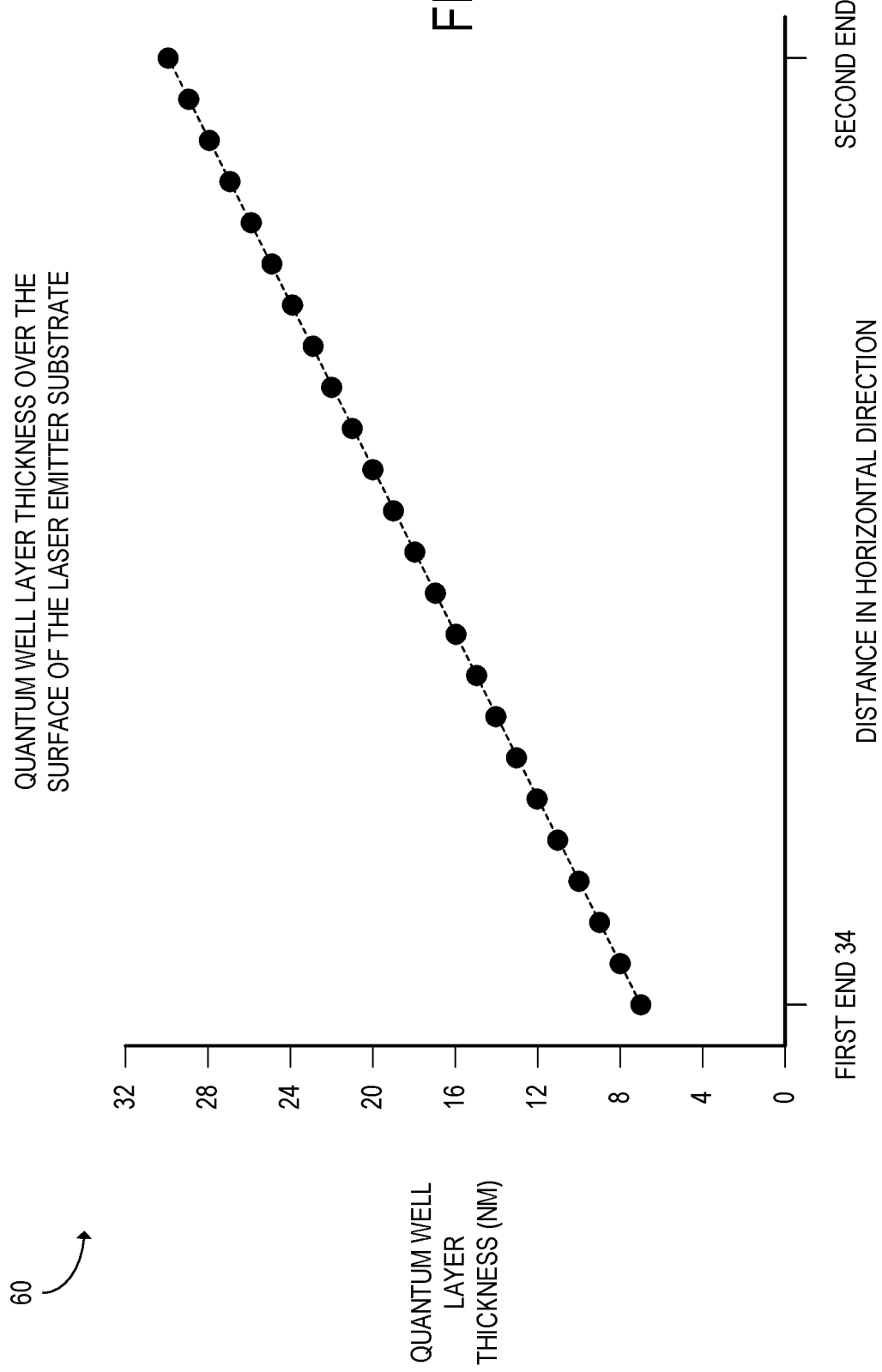
FIG. 7A shows an example plot of quantum well thickness as a function of position on the substrate when the thicknesses of the quantum well layers vary according to a linear function, according to the embodiment of FIG. 1.

FIG. 7A shows an example plot 60 of quantum well thickness $d_3$ as a function of position on the substrate 12. As shown in FIG. 7A, the respective thicknesses $d_3$ of the quantum well layers 26 of the plurality of nanowires 20 may vary according to a linear function from a first end 34 of the substrate 12 to a second end 36 of the substrate 12 along the horizontal direction 30. Since the thicknesses $d_3$ of the quantum well layers 26 vary according to a linear function in the example of FIG. 7A, the wavelengths of light emitted by the nanowires 20 may also follow a linear function from the first end 34 of the substrate 12 to the second end 36.

Figure 7B:
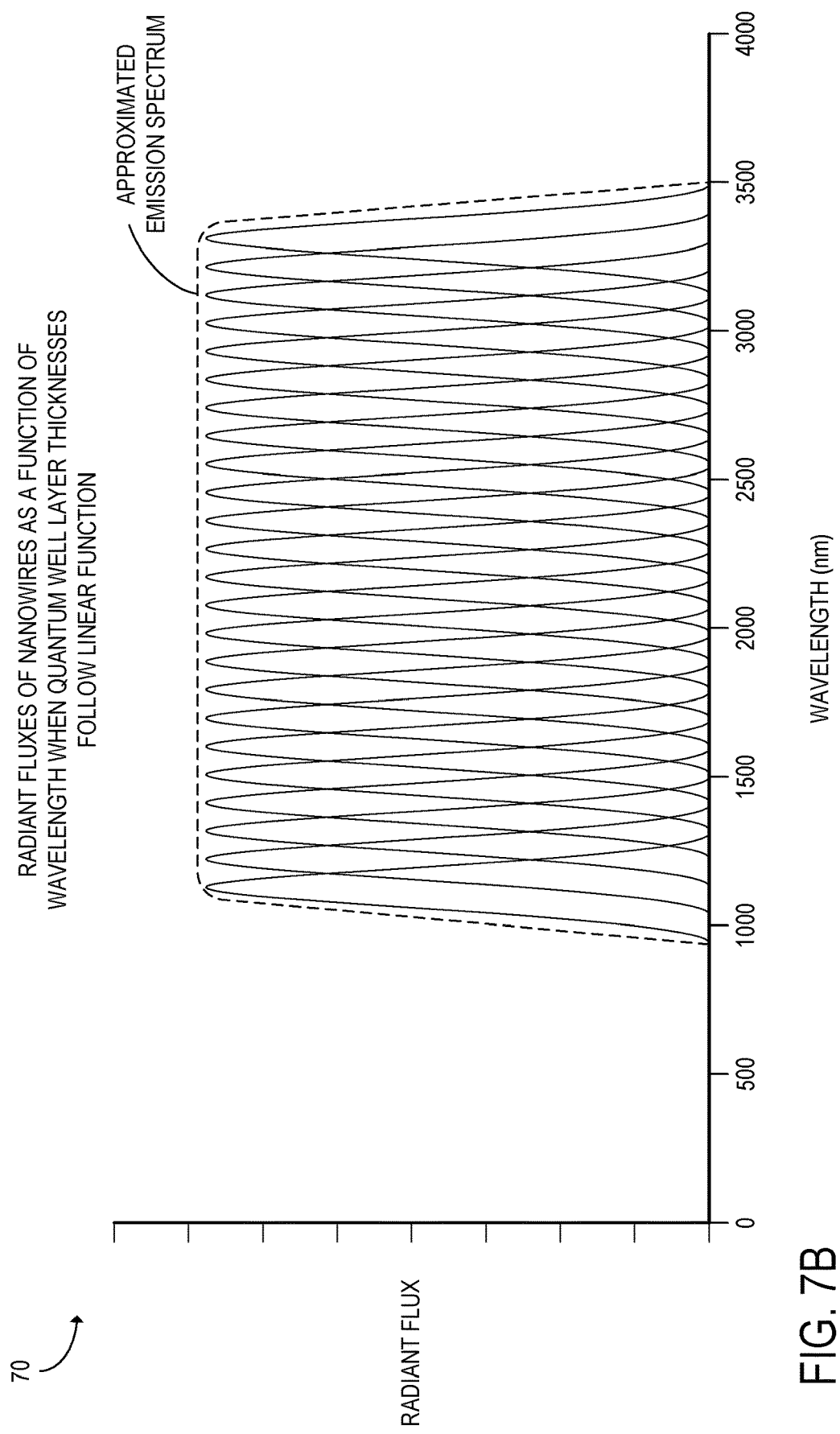
FIG. 7B shows an example plot of the respective radiant fluxes of the nanowires when the thicknesses of the quantum well layers of those nanowires follow the linear function of FIG. 7A.

FIG. 7B shows an example plot 70 of the respective radiant fluxes of the nanowires 20 when the thicknesses $d_3$ of the quantum well layers 26 of those nanowires 20 follow the linear function of FIG. 7A. In the example plot 70 of FIG. 7B, the radiant flux of the light emitted by each nanowire 20 as a function of wavelength follows a normal distribution. The peaks of these normal distributions are evenly spaced over emissive spectrum of the laser emitter 10. Thus, the radiant flux of the laser emitter 10, as a sum of the radiant fluxes of the individual nanowires 20, may be approximately constant as a function of wavelength within a range from approximately 1300 nm to 3200 nm.

Alternatively, as shown in the example plot 360 of FIG. 8A, the thicknesses $d_3$ of the quantum well layers 26 may vary according to a nonlinear function from the first end 34 of the substrate 12 to the second end 36 of the substrate 12. In the example of FIG. 8A, the thicknesses $d_3$ are more closely clustered around the median thickness of 18.5 nm than near the minimum width of 7 nm or the maximum width of 30 nm. A nonlinear distribution of thicknesses $d_3$ such as the distribution shown in FIG. 8A may be used, for example, when the laser emitter 10 is configured to be used with a detector having nonlinear sensitivity as a function of wavelength within the infrared region of the electromagnetic spectrum.

Figure 8B:
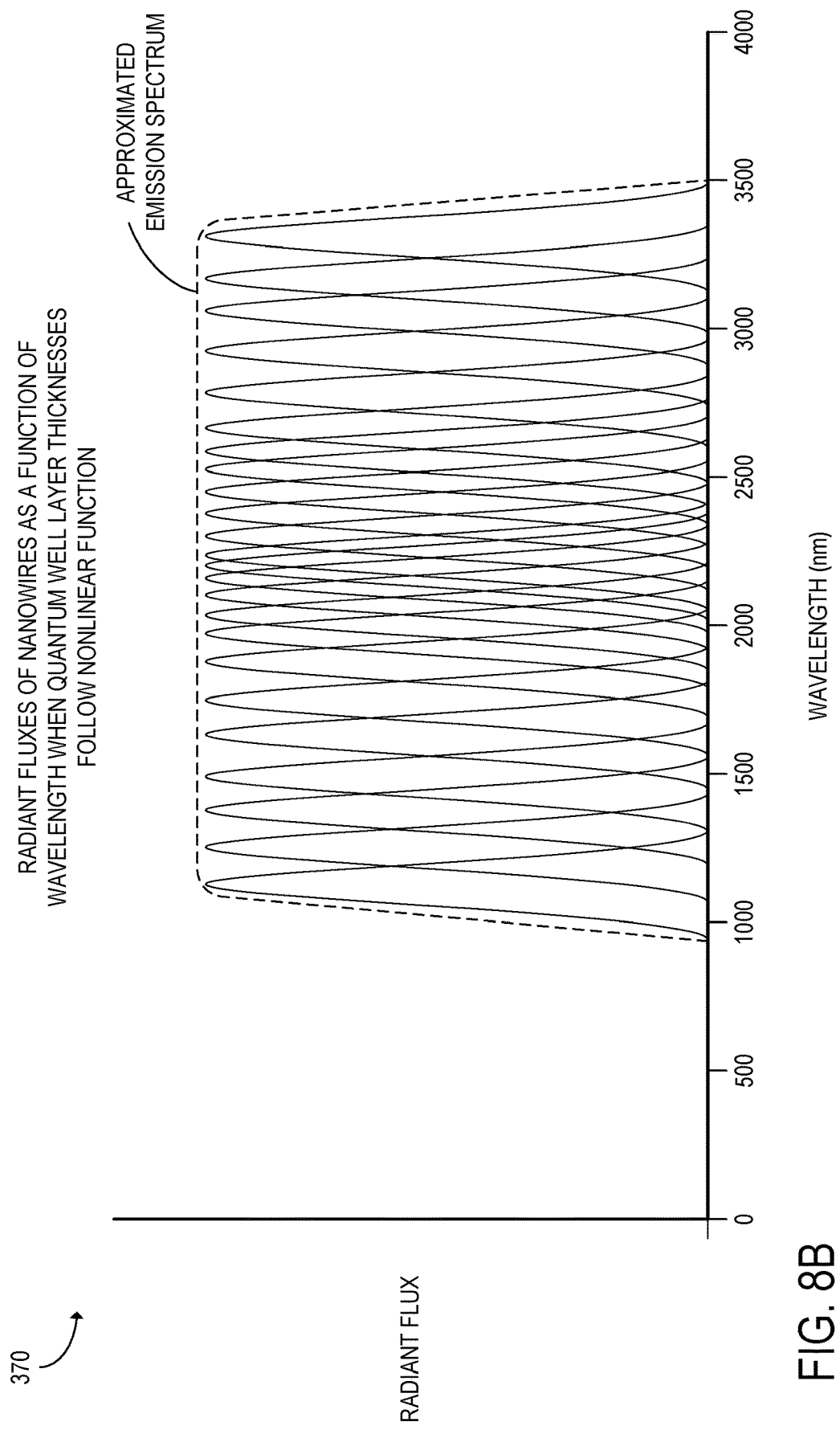
FIG. 8B shows an example plot of the respective radiant fluxes of the nanowires when the thicknesses of the quantum well layers of those nanowires follow the nonlinear function of FIG. 8A.

FIG. 8B shows an example plot 370 of the respective radiant fluxes of the nanowires 20 when the thicknesses $d_3$ of those nanowires 20 are distributed according to a nonlinear function as shown in FIG. 8A. In the example plot 370 of FIG. 8B, the wavelengths of emitted light are clustered around a median wavelength of approximately 2200 nm. As a result, the radiant flux of the laser emitter 10, as a sum of the radiant fluxes of the individual nanowires 20, may have a peak at the median wavelength.

Figure 9A:
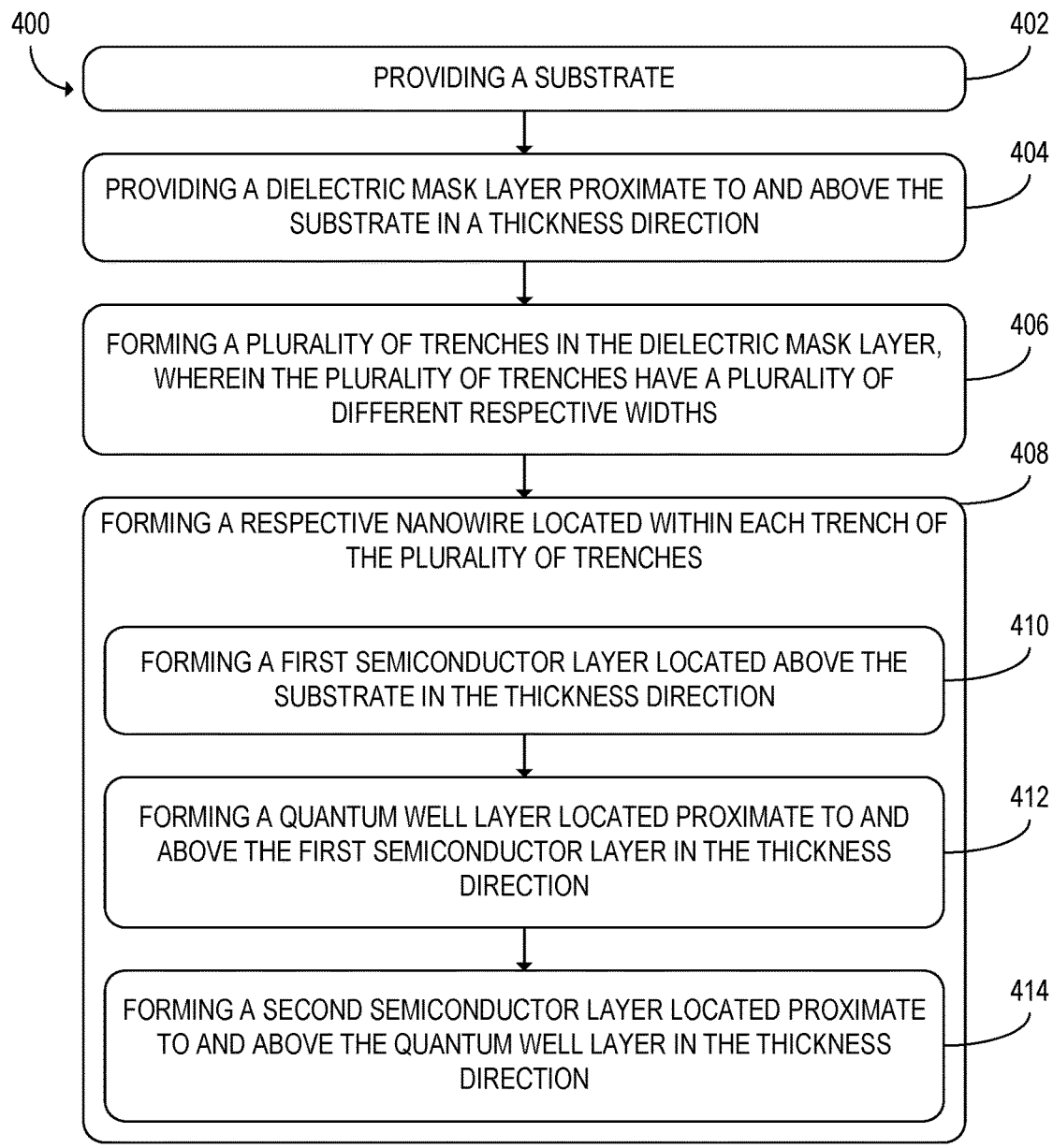
FIG. 9A shows a flowchart of an example method of manufacturing a laser emitter, according to the embodiment of FIG. 1.

FIG. 9A shows a flowchart of an example method 400 of manufacturing a laser emitter. The method 400 may include, at step 402, providing a substrate. For example, the substrate may be formed of silicon (Si), indium phosphide (InP), gallium arsenide (GaAs), or some other suitable material. The substrate may define a planar surface on which other layers of the laser emitter may be overlaid. In some embodiments, the substrate may also be used as a waveguide layer through which the laser emitter receives an optical pumping signal.

At step 404, the method 400 may further include providing a dielectric mask layer proximate to and above the substrate in a thickness direction. The dielectric mask layer 14 may be a silicon oxide ($SiO_x$) layer, such as a silicon dioxide ($SiO_2$) layer, or may alternatively be formed from some other material.

At step 406, the method 400 may further include forming a plurality of trenches in the dielectric mask layer. The plurality of trenches formed in the dielectric mask layer may have a plurality of different respective widths. For example, the respective widths of the trenches may each be between 50 nm and 300 nm. In embodiments in which the substrate defines a planar surface, the plurality of trenches may be formed to be spatially dispersed in a horizontal direction along the planar surface. The plurality of trenches may also be non-overlapping in a vertical direction along the planar surface. For example, the trenches may be substantially parallel to each other.

At step 408, the method 400 may further include forming a respective nanowire located within each trench of the plurality of trenches. Each nanowire may be formed via selective area growth. Thus, the plurality of nanowires may be grown in the plurality of trenches while inhibiting growth on the dielectric mask layer. The nanowires may, for example, be grown on the substrate using metalorganic molecular beam epitaxy, metalorganic vapor-phase epitaxy, or chemical beam epitaxy.

For each nanowire included in the laser emitter, forming that nanowire may include, at step 410, forming a first semiconductor layer located above the substrate in the thickness direction. The first semiconductor layer may, for example, be an InGaAs layer. In some embodiments, the first semiconductor layer may be a doped layer, which may be a p-type semiconductor layer or an n-type semiconductor layer. In such embodiments, the nanowire may be electrically driven by a controller.

Forming the nanowire may further include, at step 412, forming a quantum well layer located proximate to and above the first semiconductor layer in the thickness direction. In some embodiments, the quantum well layer may be in InAs layer. The thickness of the quantum well layer may be between 7 nm and 30 nm. Each quantum well layer may be formed such that it has a thickness inversely proportional to the width of the trench in which it is located. For example, each quantum well layer may be formed using substantially the same amount of InAs such that the InAs is spread more thinly in wider trenches than in narrower trenches.

In embodiments in which the substrate has a planar surface, the plurality of nanowires may be formed such that respective thicknesses of their quantum well layers vary according to a linear function from a first end of the substrate to a second end of the substrate. The thicknesses of the quantum well layers of the nanowires may vary along the horizontal direction in which the nanowires are spatially dispersed. In other embodiments, the nanowires may be formed such that their thicknesses vary according to a nonlinear function.

Forming the nanowire may further include, at step 414, forming a second semiconductor layer located proximate to and above the quantum well layer in the thickness direction. Similarly to the first semiconductor layer, the second semiconductor layer may be an InGaAs layer. The first semiconductor layer and the second semiconductor layer may have different compositions in some embodiments. In embodiments in which the first semiconductor layer and the second semiconductor layer are both InGaAs layers, the first semiconductor layer and the second semiconductor layer may be formed with different concentrations of gallium.

In embodiments in which the first semiconductor layer is a doped layer, the second semiconductor layer may also be a doped layer. When the first semiconductor layer is a p-type semiconductor layer, the second semiconductor layer may be a n-type semiconductor layer, and when the first semiconductor layer is an n-type semiconductor layer, the second semiconductor layer may be a p-type semiconductor layer. The first semiconductor layer and the second semiconductor layer may be electrically connected to a controller via respective electrical traces.

Figure 9B:
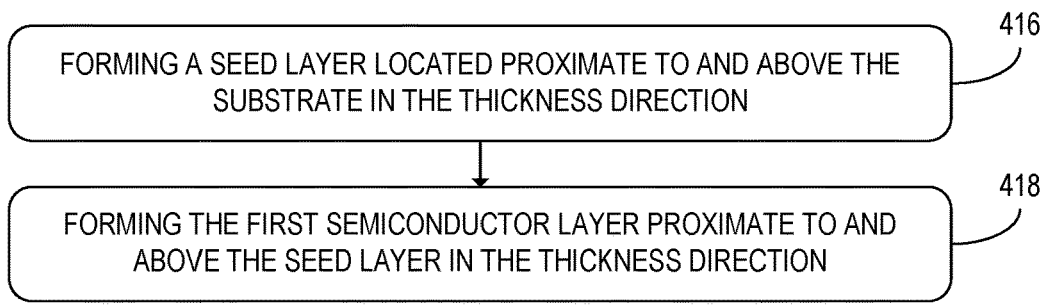
FIG. 9B shows additional steps of the method of FIG. 9A that may be performed in some implementations.

FIG. 9B shows additional steps of the method 400 that may be performed in some embodiments. The steps of FIG. 9B may be performed when forming the nanowire at step 408. At step 416, forming the nanowire may further include forming a seed layer located proximate to and above the substrate in the thickness direction. The seed layer may be a gallium arsenide antimony (GaAsSb) layer. For example, the seed layer may have a composition of $GaAsSb_{0.05}$. Alternatively, the seed layer may have some other composition. At step 418, forming the nanowire may further include forming the first semiconductor layer proximate to and above the seed layer in the thickness direction. The cross-sectional shape of the seed layer may determine the cross-sectional shapes of the other layers, and thus the cross-sectional shape of the nanowire as a whole. In some embodiments, the seed layer may be formed such that the nanowire has a trapezoidal cross-sectional shape.

Using the method discussed above, the respective thicknesses of the quantum well layers of the nanowires may be precisely controlled when manufacturing a broadband infrared laser emitter. Thus, the manufacturer of the broadband infrared laser emitter may have more control over the emission spectrum of the laser emitter than would be achieved using conventional self-organized quantum dots, and may be able to more easily and reliably manufacture a broadband infrared laser emitter that emits light at a plurality of component spectral peaks within a flattened emission spectrum, to thereby achieve a broader spectrum of emitted light than would be achieved by an emitter with single gain peak and a single peak in its emission spectrum. In addition, the nanowires of the broadband infrared laser emitter may be specifically addressable via optical or electrical pumping. The addressability of the nanowires may allow the emission of infrared light by the laser emitter to be controlled more precisely during operation relative to a laser emitter manufactured using self-organized quantum dots. Such broadband infrared light emitters may be useful in applications such as infrared video cameras, infrared depth sensors, spectroscopy, optical coherence tomography systems, and other imaging and sensing systems, for example.

Figure 10:
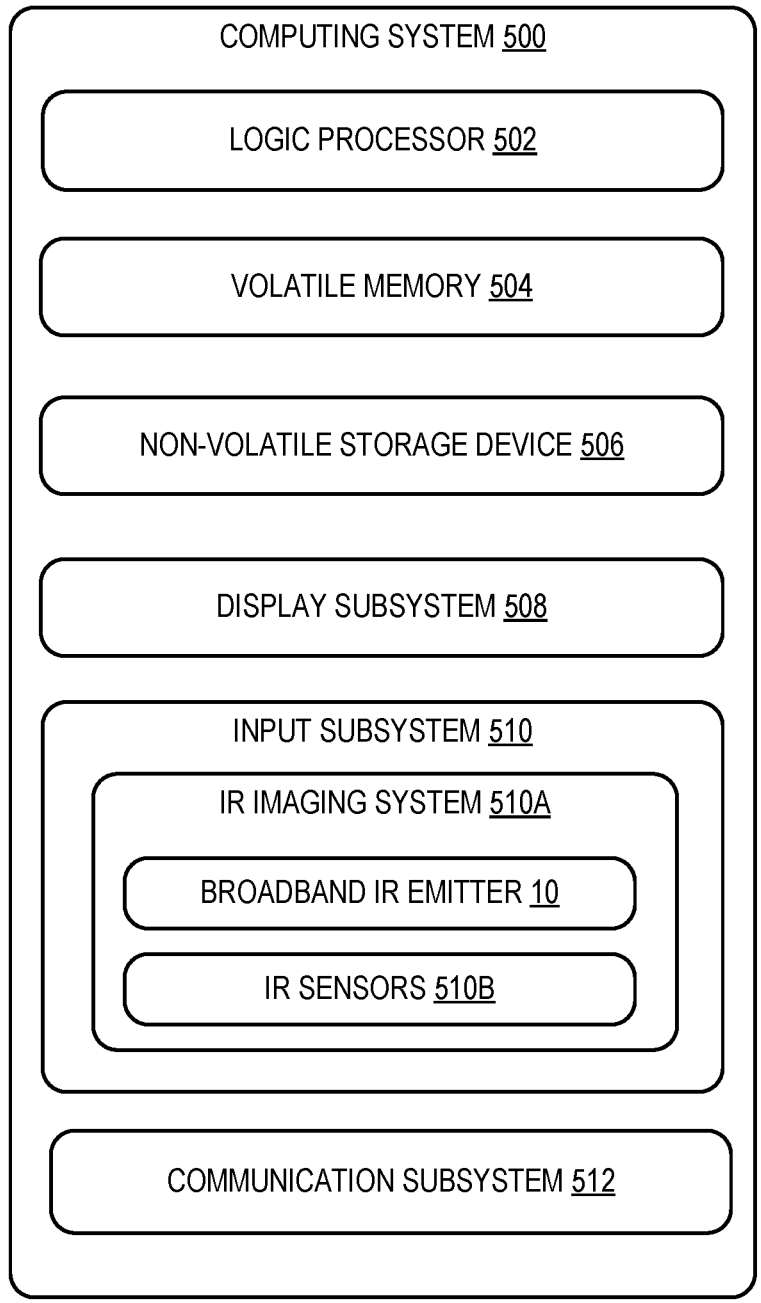
FIG. 10 shows a schematic view of an example computing environment in which the laser emitter of FIG. 1 may be included.

In some embodiments, the methods and processes described herein may be tied to a computing system of one or more computing devices. FIG. 10 schematically shows, in simplified form, a non-limiting embodiment of a computing system 500. Computing system 500 may take the form of one or more personal computers, server computers, tablet computers, home-entertainment computers, network computing devices, gaming devices, mobile computing devices, mobile communication devices (e.g., smart phone), and/or other computing devices, and wearable computing devices such as smart wristwatches and head mounted devices, as shown in FIG. 11.

Computing system 500 may include a logic processor 502, volatile memory 504, a non-volatile storage device 506, a display subsystem 508, input subsystem 510, communication subsystem 512, and/or other components not shown in FIG. 10. The logic processor 502 may execute instructions, such as software programs, stored in the non-volatile storage device 510 using portions of volatile memory 504, receiving input received from the input subsystem 510, processing the input according to the instructions, and outputting graphical display on display subsystem 508 based on the processing. The input subsystem may include an infrared imaging system 510A, including the broadband infrared emitter 10 described above, and one or more infrared sensors, such as one or more infrared cameras. The infrared imaging system 510A may be configured as a depth camera, for example. The logic processor 502 may function as the controller 250 shown in FIG. 6, for example.

Figure 11:
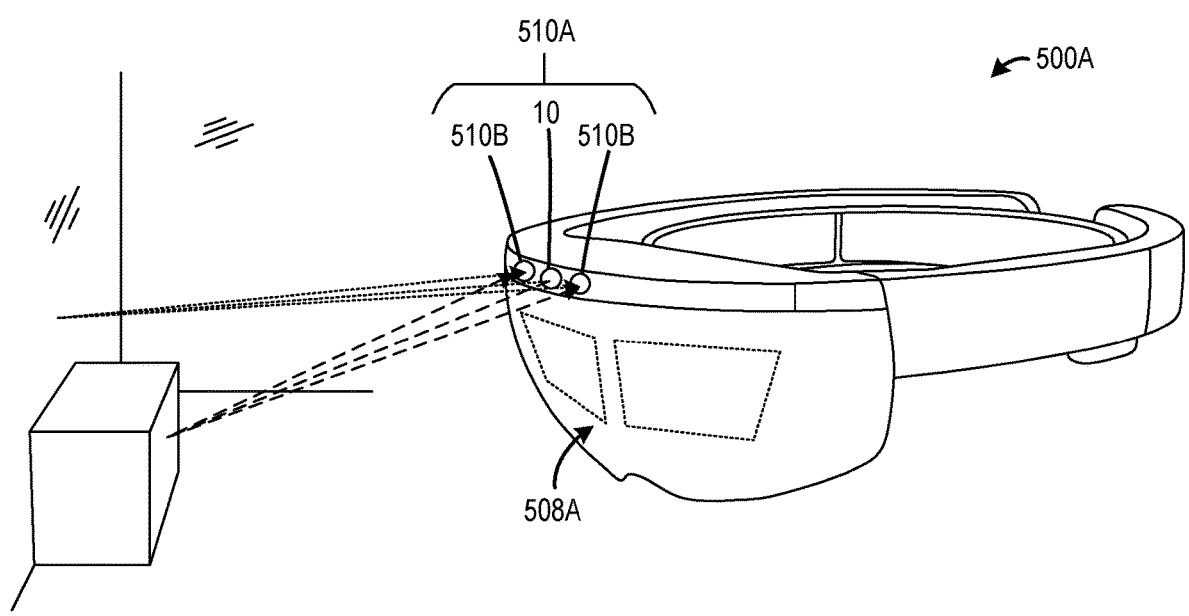
FIG. 11 shows a head mounted display device as an example computing system in which the laser emitter of FIG. 1 may be included.

As shown in FIG. 11, the computing system 500 may take the form of an augmented reality head mounted display (HMD) device 500A configured to display holographic images stereoscopically projected on a pair of at least partially transparent left and right near eye displays 508A, so as to appear to the user to be at a distance from the user positioned in the real world. HMD device 502A is equipped with the infrared imaging system 510A described above, including the broadband infrared laser emitter 10 and a pair of infrared sensors 510B. The infrared imaging system 510A may be configured as an infrared time-of-flight depth camera or an infrared structured light depth camera, for example. In a time-of-flight depth camera the time taken for the round trip of the infrared rays (dashed lines) from emission, through reflection by surfaces in the imaged environment, and back to the infrared sensors 510b is measured, and the measured values are used to compute the depth of the imaged surfaces. In a structured light depth camera, structured light (i.e., light formed in temporal and/or spatial patterns) is emitted from the emitter 10 and detected by the pair of infrared sensors 510B. Stereoscopic techniques for sensing the differences in the imaged position of the structured light patterns are used to compute the depths of surfaces in the imaged environment.

The following paragraphs describe several aspects of the present disclosure. According to one aspect of the present disclosure, a laser emitter is provided, including a substrate and a dielectric mask layer located proximate to and above the substrate in a thickness direction. The dielectric mask layer may have a plurality of trenches formed therein. The plurality of trenches may have a plurality of different respective widths. The laser emitter may further include a respective nanowire located within each trench of the plurality of trenches. Each nanowire may include a first semiconductor layer located above the substrate in the thickness direction. Each nanowire may further include a quantum well layer located proximate to and above the first semiconductor layer in the thickness direction. Each nanowire may further include a second semiconductor layer located proximate to and above the quantum well layer in the thickness direction.

According to this aspect, the quantum well layer may be an indium arsenide (InAs) layer.

According to this aspect, the first semiconductor layer and the second semiconductor layer may be indium gallium arsenide (InGaAs) layers.

According to this aspect, each nanowire may further include a seed layer located proximate to and above the substrate in the thickness direction and proximate to and below the first semiconductor layer in the thickness direction.

According to this aspect, the seed layer may be a gallium arsenide antimony (GaAsSb) layer.

According to this aspect, the dielectric mask layer may be a silicon oxide (SiO$_x$) layer.

According to this aspect, the laser emitter may be configured to emit infrared light in response to receiving an optical pumping signal.

According to this aspect, the first semiconductor layer and the second semiconductor layer may be doped layers. The laser emitter may be configured to emit infrared light in response to receiving an electrical pumping signal via the first semiconductor layer and the second semiconductor layer.

According to this aspect, the substrate may define a planar surface. The plurality of trenches may be formed to be spatially dispersed in a horizontal direction along the planar surface and non-overlapping in a vertical direction along the planar surface.

According to this aspect, respective thicknesses of the quantum well layers of the plurality of nanowires may vary according to a linear function from a first end of the substrate to a second end of the substrate along the horizontal direction.

According to this aspect, each nanowire may be formed via selective area growth.

According to this aspect, the respective widths of the trenches may each be between 50 nm and 300 nm.

According to this aspect, each quantum well layer may have a respective thickness between 7 nm and 30 nm.

According to this aspect, for each nanowire, a respective thickness of the quantum well layer of that nanowire may be inversely proportional to the width of the trench within which that nanowire is located.

According to this aspect, the laser emitter may include between 10 and 100 nanowires.

According to another aspect of the present disclosure, a method of manufacturing a laser emitter is provided. The method may include providing a substrate. The method may further include providing a dielectric mask layer proximate to and above the substrate in a thickness direction. The method may further include forming a plurality of trenches in the dielectric mask layer. The plurality of trenches may have a plurality of different respective widths. The method may further include forming a respective nanowire located within each trench of the plurality of trenches. Forming the nanowire may include forming a first semiconductor layer located above the substrate in the thickness direction. Forming the nanowire may further include forming a quantum well layer located proximate to and above the first semiconductor layer in the thickness direction. Forming the nanowire may further include forming a second semiconductor layer located proximate to and above the quantum well layer in the thickness direction.

According to this aspect, each nanowire may be formed via selective area growth.

According to this aspect, forming the nanowire may further include forming a seed layer located proximate to and above the substrate in the thickness direction. Forming the nanowire may further include forming the first semiconductor layer proximate to and above the seed layer in the thickness direction.

According to this aspect, the substrate may define a planar surface. The plurality of trenches may be formed to be spatially dispersed in a horizontal direction along the planar surface and non-overlapping in a vertical direction along the planar surface.

According to another aspect of the present disclosure, a laser emitter is provided. The laser emitter may be formed by providing a substrate. The laser emitter may be further formed by providing a dielectric mask layer proximate to and above the substrate in a thickness direction. The laser emitter may be further formed by forming a plurality of trenches in the dielectric mask layer. The plurality of trenches may have a plurality of different respective widths. The laser emitter may be further formed by forming a respective nanowire located within each trench of the plurality of trenches. Forming the nanowire may include forming a first semiconductor layer located above the substrate in the thickness direction. Forming the nanowire may further include forming a quantum well layer located proximate to and above the first semiconductor layer in the thickness direction. Forming the nanowire may further include forming a second semiconductor layer located proximate to and above the quantum well layer in the thickness direction.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A laser emitter comprising:
a substrate;
a dielectric mask layer located proximate to and above the substrate in a thickness dimension, the dielectric mask layer having three or more trenches formed therein, wherein the three or more trenches have a plurality of different respective widths of varying sizes in a width dimension that is orthogonal to the thickness dimension;
three or more nanowires, including a respective nanowire of the three or more nanowires located at least partially within each trench of the three or more trenches, each nanowire of the three or more nanowires including:
a first semiconductor layer located above the substrate in the thickness dimension,
a quantum well layer located proximate to and above the first semiconductor layer in the thickness dimension, and
a second semiconductor layer located proximate to and above the quantum well layer in the thickness dimension,
wherein respective thicknesses of the quantum well layers of the three or more nanowires vary according to a linear or non-linear function,
wherein the respective thicknesses of the quantum well layers of the three or more nanowires in the thickness dimension define a plurality of component spectral peaks at different wavelengths for the respective nanowires; and
a controller configured to control the laser emitter by selectively varying optical pumping signals transmitted to the three or more nanowires, to thereby cause the laser emitter to emit light at the plurality of component spectral peaks within a flattened emission spectrum.

2. The laser emitter of claim 1, wherein the quantum well layer is an indium arsenide (InAs) layer.

3. The laser emitter of claim 1, wherein the first semiconductor layer and the second semiconductor layer are indium gallium arsenide (InGaAs) layers.

4. The laser emitter of claim 1, wherein each nanowire further includes a seed layer located proximate to and above the substrate in the thickness dimension and proximate to and below the first semiconductor layer in the thickness dimension.

5. The laser emitter of claim 4, wherein the seed layer is a gallium arsenide antimony (GaAsSb) layer.

6. The laser emitter of claim 1, wherein the dielectric mask layer is a silicon oxide ($SiO_x$) layer.

7. The laser emitter of claim 1, wherein the laser emitter is configured to emit infrared light in response to receiving an optical pumping signal.

8. The laser emitter of claim 1, wherein:
the substrate defines a planar surface; and
the three or more trenches are formed to be spatially dispersed in the width dimension along the planar surface and non-overlapping in a vertical dimension orthogonal to the width dimension and the thickness dimension along the planar surface.

9. The laser emitter of claim 1, wherein each nanowire is formed via selective area growth.

10. The laser emitter of claim 1, wherein the respective widths of the trenches are each between 50 nm and 300 nm.

11. The laser emitter of claim 1, wherein each quantum well layer has a respective thickness between 7 nm and 30 nm.

12. The laser emitter of claim 1, wherein for each nanowire, a respective thickness of the quantum well layer of that nanowire is inversely proportional to the width of the trench within which that nanowire is located.

13. The laser emitter of claim 1, wherein the laser emitter includes between 10 and 100 nanowires.

14. The laser emitter of claim 1, wherein the three or more nanowires are configured to receive the optical pumping signals via the substrate.

15. A method of manufacturing a laser emitter, the method comprising:
providing a substrate;
providing a dielectric mask layer proximate to and above the substrate in a thickness dimension;
forming three or more trenches in the dielectric mask layer, wherein the three or more trenches have a plurality of different respective widths of varying sizes in a width dimension that is orthogonal to the thickness dimension;
forming three or more nanowires, wherein the three or more nanowires include a respective nanowire of the three or more nanowires located at least partially within each trench of the three or more trenches, wherein forming each nanowire of the three or more nanowires includes:
forming a first semiconductor layer located above the substrate in the thickness dimension,
forming a quantum well layer located proximate to and above the first semiconductor layer in the thickness dimension, and
forming a second semiconductor layer located proximate to and above the quantum well layer in the thickness dimension;
wherein respective thicknesses of the quantum well layers of the three or more nanowires vary according to a linear or non-linear function, and
wherein the respective thicknesses of the quantum well layers of the three or more nanowires in the thickness dimension define a plurality of component spectral peaks at different wavelengths for the respective nanowires; and
providing a controller configured to control the laser emitter by selectively varying optical pumping signals transmitted to the three or more nanowires, to thereby cause the laser emitter to emit light at the plurality of component spectral peaks within a flattened emission spectrum.

16. The method of claim 15, wherein each nanowire is formed via selective area growth.

17. The method of claim 15, wherein forming the nanowire further includes:
forming a seed layer located proximate to and above the substrate in the thickness dimension; and
forming the first semiconductor layer proximate to and above the seed layer in the thickness dimension.

18. The method of claim 15, wherein:
the substrate defines a planar surface; and
the three or more trenches are formed to be spatially dispersed in the width dimension along the planar surface and non-overlapping in a vertical dimension orthogonal to the width dimension and the thickness dimension along the planar surface.

19. The method of claim 15, wherein for each nanowire, a respective thickness of the quantum well layer of that nanowire is inversely proportional to the width of the trench within which that nanowire is located.

20. A laser emitter formed by:
providing a substrate;
providing a dielectric mask layer proximate to and above the substrate in a thickness dimension;
forming three or more trenches in the dielectric mask layer, wherein the three or more trenches have a plurality of three or more different respective widths of varying sizes in a width dimension that is orthogonal to the thickness dimension; and
forming three or more nanowires, wherein the three or more nanowires include a respective nanowire of the three or more nanowires located at least partially within each trench of the three or more trenches, wherein forming each nanowire of the three or more nanowires includes:
forming a first semiconductor layer located above the substrate in the thickness dimension,
forming a quantum well layer located proximate to and above the first semiconductor layer in the thickness dimension, and
forming a second semiconductor layer located proximate to and above the quantum well layer in the thickness dimension;
wherein respective thicknesses of the quantum well layers of the three or more nanowires vary according to a linear or non-linear function, and
wherein the respective thicknesses of the quantum well layers of the three or more nanowires in the thickness dimension define a plurality of component spectral peaks at different wavelengths for the respective nanowires; and
providing a controller configured to control the laser emitter by selectively varying optical pumping signals transmitted to the three or more nanowires, to thereby cause the laser emitter to emit light at the plurality of component spectral peaks within a flattened emission spectrum.

\* \* \* \* \*